United States Patent [19]
Miyai et al.

[11] Patent Number: 5,537,584
[45] Date of Patent: Jul. 16, 1996

[54] POWER INSTABILITY CONTROL OF A MEMORY CARD AND A DATA PROCESSING DEVICE THEREFOR

[75] Inventors: Hiroyuki Miyai; Yuzou Matsuo, both of Ibaraki-ken, Japan

[73] Assignee: Hitachi Maxell, Ltd., Osaka, Japan

[21] Appl. No.: 368,766

[22] Filed: Jan. 4, 1995

Related U.S. Application Data

[63] Continuation of Ser. No. 83,313, Jun. 29, 1993, which is a continuation of Ser. No. 536,763, Jun. 12, 1990, abandoned.

[30] Foreign Application Priority Data

| Jun. 13, 1989 | [JP] | Japan | 1-150035 |
| Jun. 13, 1989 | [JP] | Japan | 1-150036 |
| Jun. 13, 1989 | [JP] | Japan | 1-150037 |

[51] Int. Cl.⁶ .................................. G06F 11/00
[52] U.S. Cl. .................. 395/183.18; 395/750; 395/427; 364/DIG. 1; 364/285
[58] Field of Search ............. 364/200, 900; 395/200, 425, 575, 750

[56] References Cited

U.S. PATENT DOCUMENTS

| 4,016,408 | 4/1977 | Koetzle | 235/153 |
| 4,339,809 | 7/1982 | Stewart | 365/206 |
| 4,461,003 | 7/1984 | Tamaki | 371/66 |
| 4,538,058 | 8/1985 | Ugon et al. | 235/380 |
| 4,584,622 | 4/1986 | Crosby et al. | 361/56 |
| 4,586,179 | 4/1986 | Sirazi et al. | 371/12 |
| 4,767,920 | 8/1988 | Kitta et al. | 235/492 |
| 4,785,166 | 11/1988 | Kushima | 235/441 |
| 4,835,737 | 5/1989 | Herrig et al. | 364/900 |
| 4,878,164 | 10/1989 | Colombo | 363/49 |
| 4,889,495 | 12/1989 | Kimura | 439/60 |
| 4,912,346 | 3/1990 | Mizuta | 307/475 |
| 4,916,662 | 4/1990 | Mizuta | 365/52 |
| 4,930,129 | 5/1990 | Takahira | 371/40.4 |
| 4,943,868 | 7/1990 | Yoshinaga et al. | 358/404 |
| 4,964,011 | 10/1990 | Sternglass | 361/88 |
| 4,979,144 | 12/1990 | Mizuta | 364/900 |
| 4,990,760 | 2/1991 | Tomari et al. | 235/492 |
| 5,047,988 | 9/1991 | Mizuta | 365/229 |
| 5,056,009 | 10/1991 | Mizuta | 364/200 |
| 5,056,060 | 10/1991 | Fitch et al. | 364/900 |
| 5,058,075 | 10/1991 | Mizuta | 365/229 |
| 5,072,103 | 12/1991 | Nara | 235/492 |
| 5,083,286 | 1/1992 | Himo et al. | 395/115 |
| 5,245,582 | 9/1993 | Kimura | 365/229 |
| 5,300,765 | 4/1994 | Mizuta | 235/492 |

FOREIGN PATENT DOCUMENTS

| 59-90277 | 5/1984 | Japan |

OTHER PUBLICATIONS

Abstract of JP-A-5990277.

*Primary Examiner*—Christopher B. Shin

[57] ABSTRACT

A memory card and a data processing device for preventing erroneous writing operation to the memory card at the time of inserting into and pulling out from the data processing device. For the purpose of preventing the erroneous writing operation to the card at the time of inserting into the data processing device, an enable signal generating circuit of the memory card is arranged not to generate an enable signal in an unstable time period during which chattering takes place when the card starts receiving power from the external data processing device through a voltage detecting circuit of the card and the received power supply voltage reaches a predetermined level. For the purpose of preventing the erroneous writing operation to the card at the time of pulling out from the data processing device, a capacitor is connected between a power supply line of the card and the ground so that a chip select signal is maintained at high level until an enable signal becomes high level. Also disclosed a data processing system which comprises the memory card and the data processing device and wherein an initial reset circuit for a microprocessor in the data processing device supplies its output to one of chip select terminals of the memory card.

16 Claims, 7 Drawing Sheets

POWER INSTABILITY CONTROL OF A MEMORY CARD AND A DATA PROCESSING DEVICE THEREFOR

This application is a continuation of application Ser. No. 08/083,313 filed on Jun. 29, 1993, which is a continuation of application Ser. No. 07/536,763, filed on Jun. 12, 1990, both of which are now abandoned.

BACKGROUND OF THE INVENTION

The present invention generally relates to memory cards and, more particularly, to a memory card which is operated in response to a chip select signal as a negative logical signal to prevent erroneous operation of the card when inserted into and pulled out from a data processing device such as a reader/writer as a main device.

The present invention also concerns data processing systems which comprises a memory card and a data processing device and, in particular, a data processing system which is operated in response to two chip select signals of positive and negative logics when a memory card is inserted into the data processing device and wherein as soon as the data processing device as a main device is reset, the operation of the memory card is stopped to prevent erroneous operation of the memory card.

A memory card usually comprises a decoder and a plurality of memory ICs (in other words, integrated circuits or memory elements having a memory function) which are arranged so that the decoder selects one of the plurality of memory ICs.

In this sort of prior art memory card having a plurality of memory ICs, the logic of a chip select signal CS to the memory card is determined by the configuration of the memory ICs. In particular, in the case where the memory card is arranged so as to be operated (become significant) when the chip select signal is at its low ("L") level, the card tends to be highly subjected to an erroneous writing operation in the unstable period of a power supply voltage at the time of inserting the memory card into the data processing device or at the time of pulling out from the data processing device because the power supply voltage abruptly drops at that time.

More in detail this is because terminals for reception of such control signals as chip select signals and read/write signals are pulled up with respect to an external power supply voltage Vcc and further an enable signal output terminal to the decoder is also pulled up directly or indirectly, for which reason the power voltage becomes unstable and the enable signal and the external chip select signals are directly affected.

Figure 1:
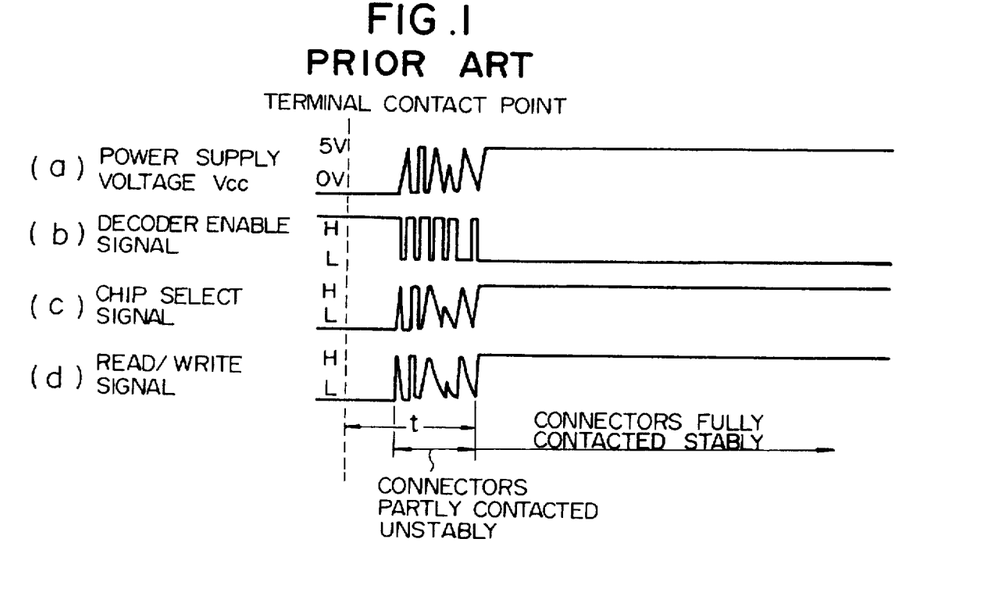
FIG. 1 is a timing chart of control signals affected by chattering when a prior art memory card is inserted.

FIG. 1 is a timing chart for explaining the state of various signals at the time of inserting the memory card into the data processing device. It will be seen from the drawing that, until the memory card is inserted into the data processing device to such an extent that a connector provided on the memory card is fully connected with a connector provided to the data processing device, chattering takes place in the beginning part of a power voltage Vcc as shown by (a) in FIG. 1. The chattering part of the power voltage Vcc causes an enable signal (significant for "L" level) on the decoder, external chip select signal and a read/write signal is also chattered, as shown by (b), (c) and (d) in FIG. 1. The chattering phenomenon results in that there occurs when the chip select signal is at "L" level and simultaneously the read/write signal is at "L" level, at which time the data stored in the memory ICs may be undesirably rewritten because the write conditions to the memory ICs are satisfied. In the drawing, reference symbol t denotes a time period from the beginning of supply of the power to the end of the chattering generation period.

Figure 2:
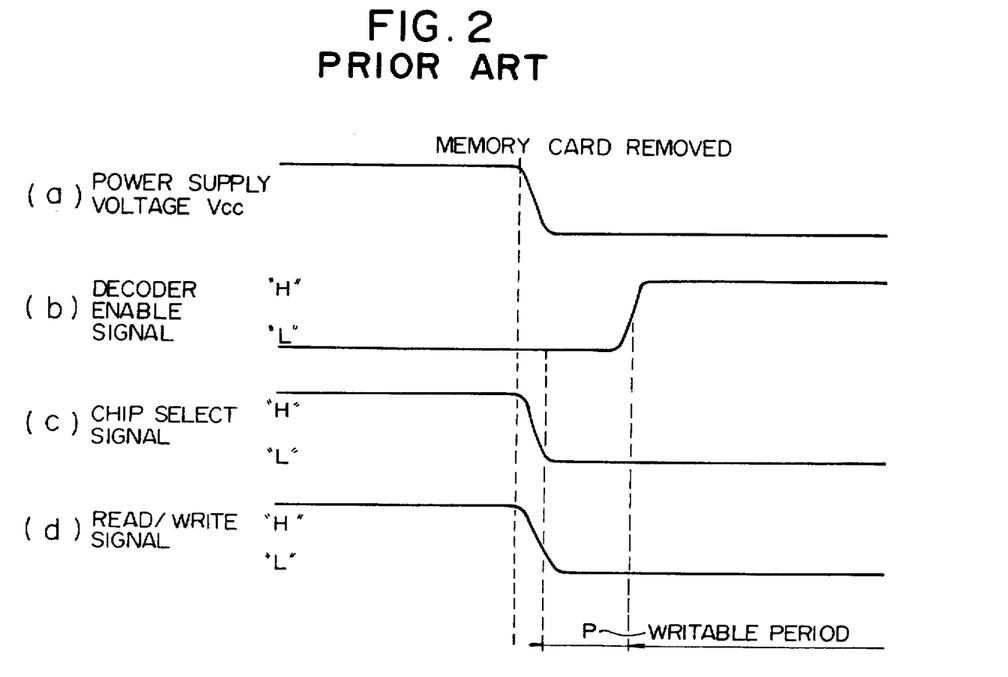
FIG. 2 is a timing chart of the control signals affected by chattering when the prior art memory card is removed.

Shown in FIG. 2 is a timing chart when the memory card is removed from the data processing device. As will be seen from the drawing, when the memory card is removed to disconnect the connector of the card from that of the data processing device, the externally-supplied power voltage Vcc first drops as shown by (a) in FIG. 2. Under the influence of a drop in the power voltage Vcc, voltages at a chip select signal terminal and at a write control signal terminal drop and the externally-received chip select signal and the read/write control signal drop down to their "L" level, as shown by (c) and (d) in FIG. 2. However, since the enable signal to the decoder is usually generated after a voltage detecting circuit detects a drop in the power supply voltage Vcc, the generation of the enable signal is delayed by the operation time of the voltage detecting circuit is later than a timing when the chip select signal and read/write control signal drop. That is, the enable signal rises to its "H" (high) level at such a timing as shown by (b) in FIG. 2. For this reason, there occurs when the chip select signal and read/write signal are both at "L" level (which period corresponds to P in FIG. 2), that the write conditions to the memory ICs are satisfied and thus the data stored in the memory ICs may be undesirably rewritten.

On the other hand, the data processing device to be inserted with the memory card usually includes a microprocessor (which will be hereinafter sometimes referred as the MPU,) and an initial reset circuit which constantly sends a reset signal to a reset terminal of the MPU unless the power supply voltage is in a predetermined voltage range both at the time of turning ON and OFF the power.

Figure 3:
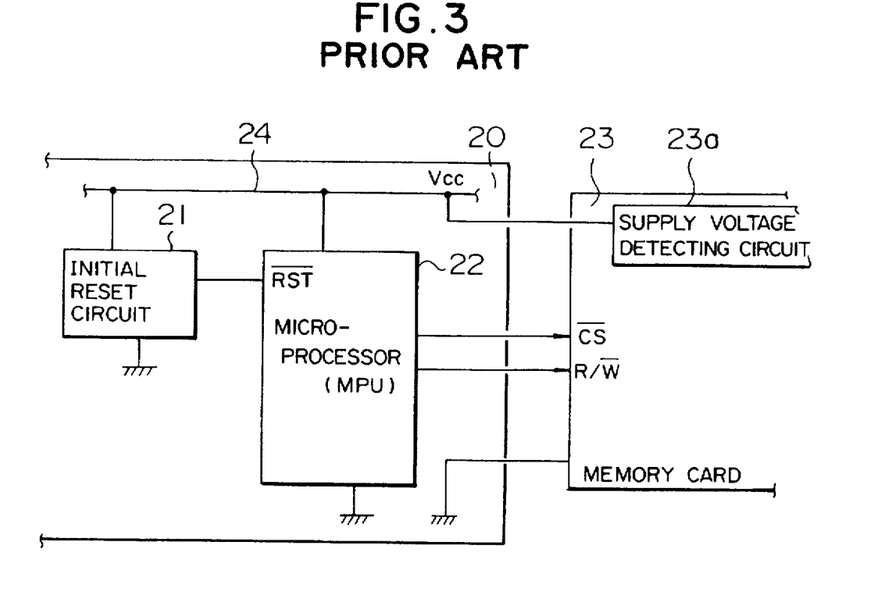
FIG. 3 is a block diagram of a prior art data processing system including a memory card and a data processing device.

FIG. 3 shows a prior art data processing system which includes a data processing device 20 and a memory card 23, when the card is inserted in the data processing device. More specifically, the data processing device 20 includes an initial reset circuit 21 and an MPU 22. The initial reset circuit 21 incorporates therein a voltage detecting circuit which acts to detect a power supply voltage fed to the data processing device and when the detected voltage is out of the predetermined voltage range both at the time of turning ON and OFF the power, to put the MPU 22 in its reset state. The memory card 23, on the other hand, includes a power voltage detecting circuit 23a for detecting the level of the power voltage supplied from the data processing device to switch between power supplied from the data processing device 20 through a power supply line 24 and power supplied from a battery incorporated therein. In this case, the voltage detection level of the voltage detecting circuit of the initial reset circuit 21 and that of the voltage detecting circuit 23a of the memory card 23 are set independently of each other and thus mutually independently operated.

With such an arrangement, when the power supply voltage Vcc on the power supply line 24 on the side of the data processing device 20 drops down to below the predetermined voltage detection level as shown by (a) in FIG. 4, a reset signal ($\overline{\text{RST}}$) such as shown by (b) is generated at the initial reset circuit 21 and thus the supply voltage of the power supply line 24 to the memory card 23 also drops. At this time, the MPU 22 is reset by the initial reset circuit 21, but even when the MPU 22 is reset, the memory card 23 remains operative unless the voltage detecting circuit 23a of the memory card 23 detects the drop of the supply voltage. In other words, it is, when the power voltage detecting circuit 23a of the memory card 23 detects a further drop in the power supply voltage Vcc of FIG. 4, (a) to inhibit the generation of the enable signal (significant with "L" level) of FIG. 4, (c) fed to the decoder, that the operation of the memory card 23 is stopped.

Figure 4:
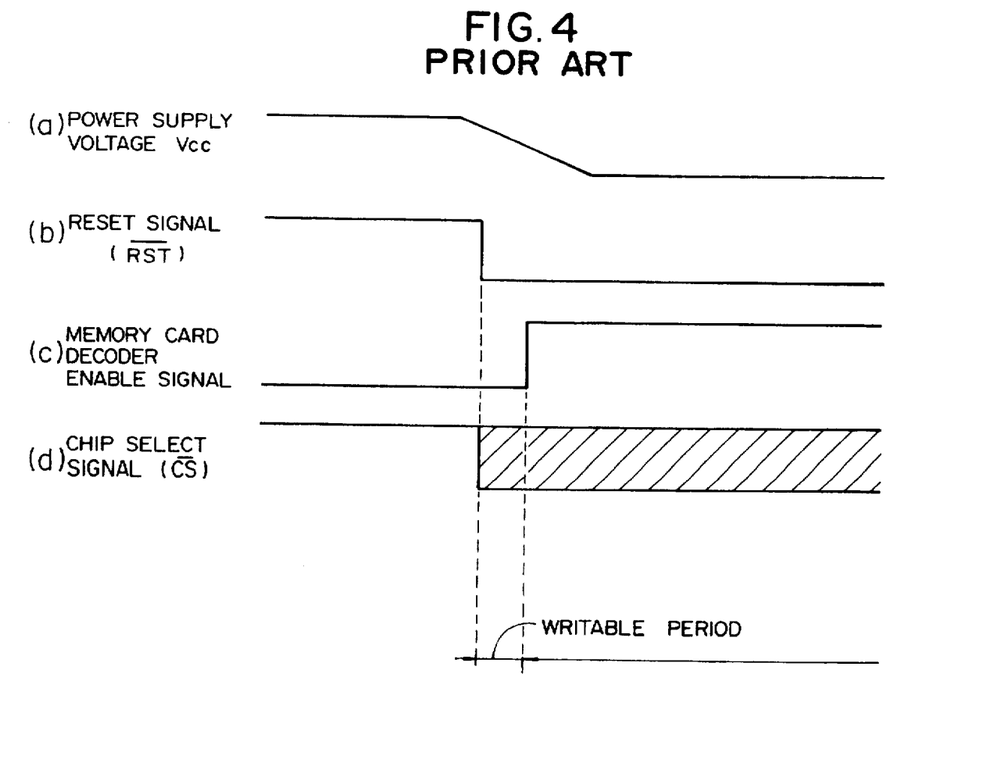
FIG. 4 is a timing chart of control signals for explaining the resetting operation of the system of FIG. 3.

Under such a condition, the chip select signal $\overline{CS}$ and read/write signal R/$\overline{W}$ sent from the MPU 22 become unstable and there occurs when the chip select signal $\overline{CS}$ becomes "L" level as shown by (d) in FIG. 4. Accordingly, a writable period is produced between the generation of the reset signal and the generation of the enable signal. Since the write conditions to the memory card 23 are satisfied in the writable period, the data stored in the memory ICs may be undesirably rewritten or erased.

SUMMARY OF THE INVENTION

It is an object of the present invention to provide a memory card which can prevent the destruction of data of the card due to the erroneous operation caused when the card is inserted into and removed out of a data processing device.

Another object of the present invention is to provide a data processing system comprising a memory card and a data processing device, in which when the data processing device as a main device is reset, the memory card is made inoperative.

In accordance with an aspect of the present invention, there is provided a memory card which comprises a plurality of memory ICs, a decoder for decoding part of address signals received from an external apparatus and selecting one of the plurality of memory ICs, and a power supply circuit for switching between power supplied from the external apparatus and power supplied from a battery incorporated in the memory card; the power supply circuit comprises a voltage detecting circuit for detecting whether or not a power supply voltage of the power supplied from the external apparatus exceeds a predetermined value, and an enable signal generating circuit for receiving a detection signal detected by the voltage detecting circuit and for generating and sending an enable signal to the decoder at a timing following unstable time periods of input signals during which chattering takes place at the time of inserting the memory card.

In this way, the enable signal generating circuit, in response to the output signal of the voltage detecting circuit, generates the enable signal to the decoder at the suitable timing following the unstable time periods of input signals during which chattering takes place. As a result, when the signals are unstable, the decoder is made inoperative so that the selection of the memory ICs are prevented and erroneous write operation based on the chattering can be reliably prevented. Further, when the enable signal to the decoder is generated, the control signals and power supply voltage are all stable at the same time with the decoder itself, whereby the other erroneous operation can be also avoided and the data stored in the memory ICs can be protected.

In accordance with another aspect of the present invention, there is provided a memory card having a chip select signal terminal for reception of a chip select signal from such external apparatus as a reader/writer and a write control signal terminal for reception of a write control signal are connected to a power supply terminal as pulled up to a supply power, a capacitor is provided between a line connected to the power supply terminal and the ground, and when the card is removed, a current from the capacitor causes voltages at the chip select terminals and at the write control signal terminal is maintained within a logical "H" level range at least until the enable signal is stopped.

In this way, since the capacitor is provided between the external power supply terminal and ground, even when the card is removed from the data processing device, an immediate drop of the voltage is avoided so that the voltages at the pulled-up chip select signal terminals and at the write control signal terminal can be also slowly reduced, whereby the levels of terminal voltages can be kept within the "H" level range until the enable signal to the decoder is stopped. As a result, the writable period, which would be produced at the time of removing the card in the prior art, is eliminated and therefore any erroneous writing operation can be prevented.

In accordance with a further aspect of the present invention, there is provided a data processing system which includes a data processing device and a memory card to be inserted into the data processing device, and wherein the data processing device includes a microprocessor and a reset circuit for resetting the microprocessor when a power supply voltage is below a predetermined level, the memory card has first and second chip select terminals, a memory select signal is sent from the microprocessor to the first chip select terminal while a reset signal is sent from the reset circuit to the second chip select terminal, so that the memory card becomes inoperative when the card receives the reset signal while the card becomes operative when the card does not receive a reset signal but the select signal.

In this way, since one of the two terminals of the memory card for reception of the two chip select signals is used for receiving the chip select signal from the MPU of the data processing device while the other terminal is used for receiving the reset signal generated at the data processing device to avoid the selection of the memory ICs based on the reset signal, the memory card can be made inoperative as soon as the data processing device is reset.

As a result, even when the power supply voltage of the data processing device having the memory card inserted drops or even when the power supply voltage is cut off due to a power failure, the memory card will not be affected by the power voltage drop or cut-off, that is, an erroneous writing operation of the card can be avoided and the data stored in the card can be safely preserved.

BRIEF DESCRIPTION OF THE DRAWINGS

FIGS. 6-1 and 6-2 are timing charts of control signals appearing in the memory card of FIG. 5 when the card is inserted;

DESCRIPTION OF THE PREFERRED EMBODIMENTS

The present invention will be explained by referring to embodiments of the present invention shown in the attached drawings.

Figure 5:
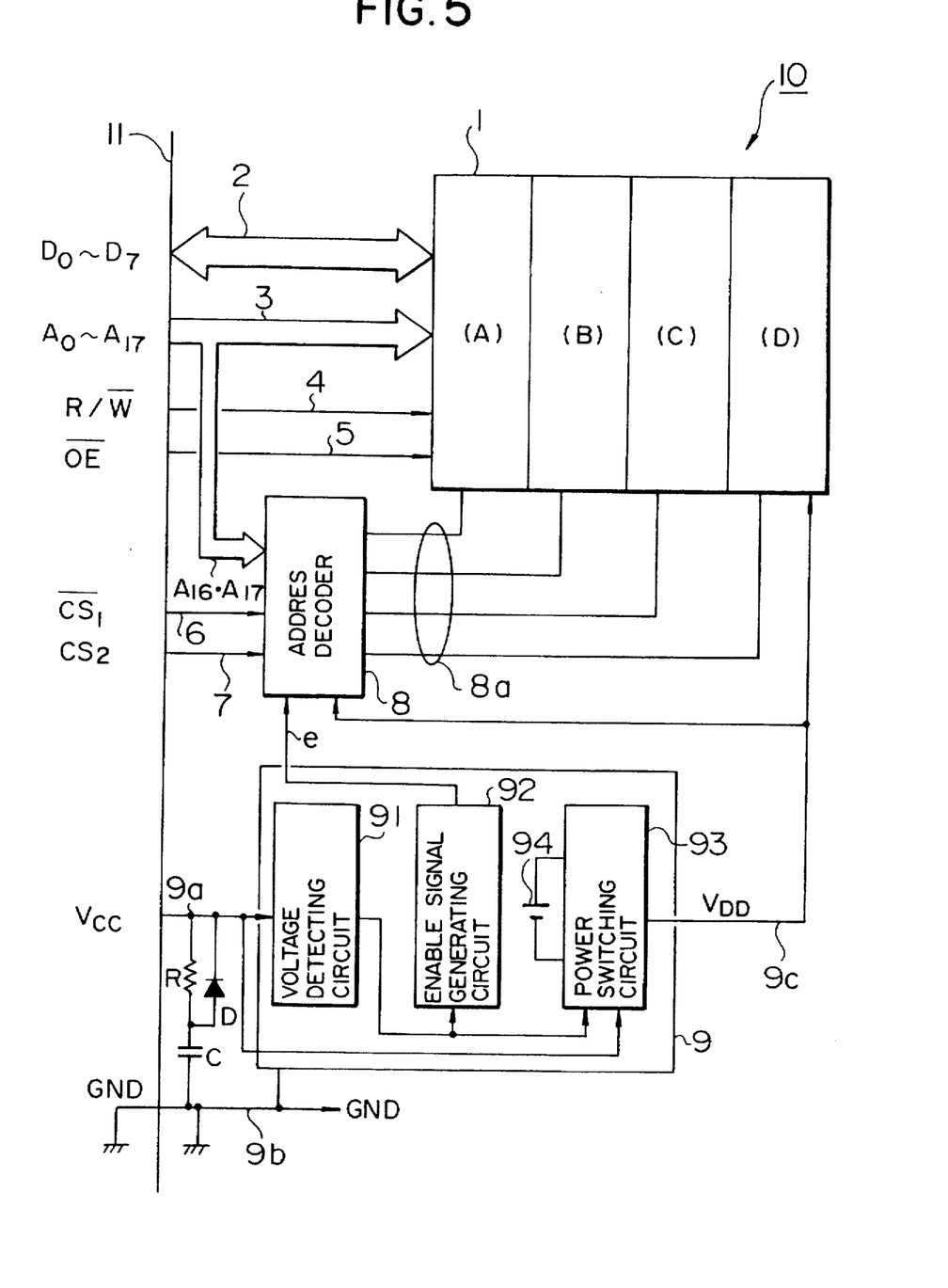
FIG. 5 is an embodiment of a memory card in accordance with an embodiment of the present invention.
Figure 7:
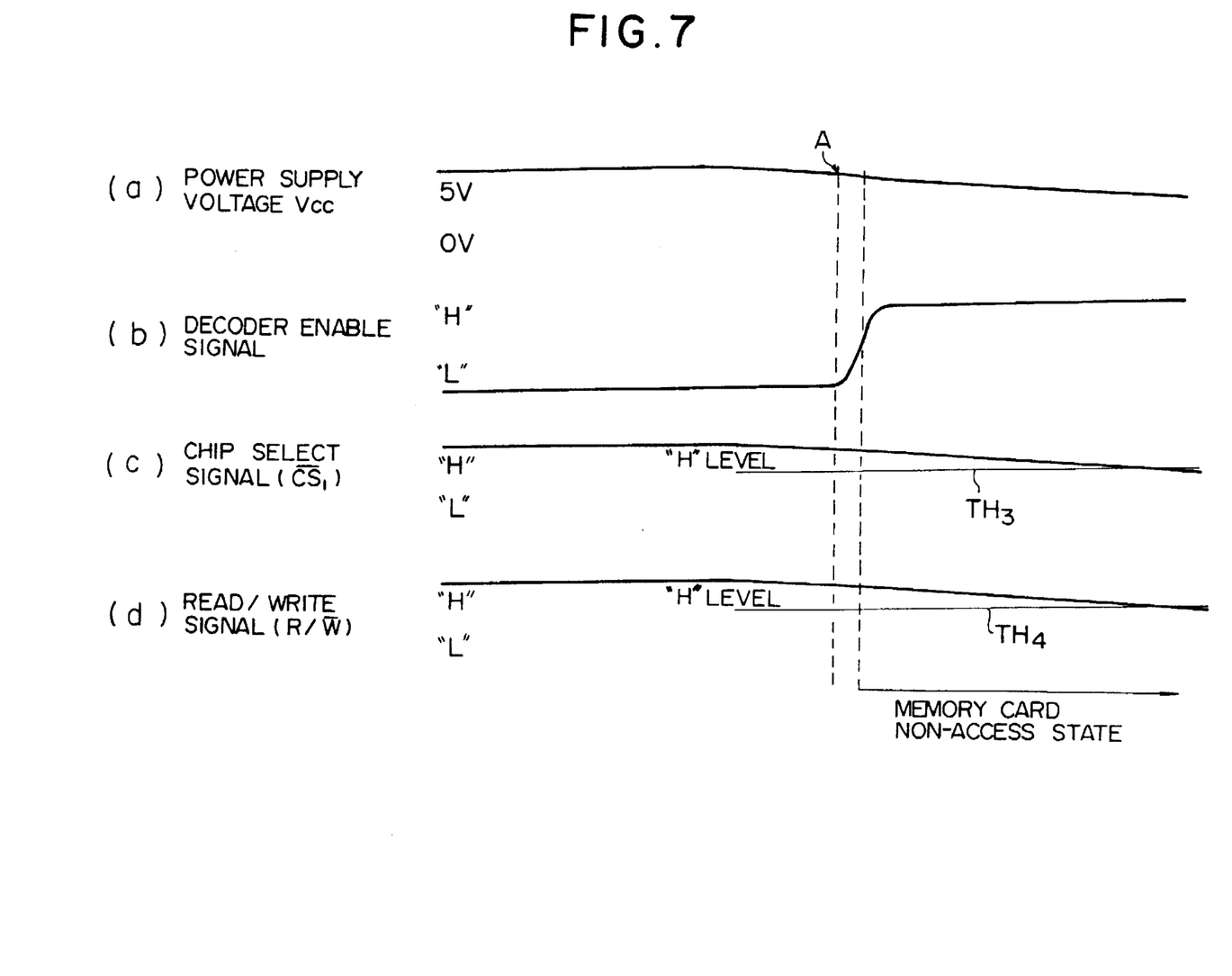
FIG. 7 is a timing chart of the control signals appearing in the memory card of FIG. 5 when the card is removed.

Referring first to FIG. 5, there is shown a block diagram of an embodiment of a memory card to which the present invention is applied, FIGS. 6-1 and 6-2 are timing charts of signals including an enable signal with respect to an address decoder generated when the card is inserted, and FIG. 7 is a timing chart of the signals including the enable signal with respect to the address decoder generated when the card is removed.

In FIG. 5, a memory card 10 comprises a memory IC section 1, an address decoder 8 and a power supply circuit 9. The memory IC section 1 has four memory ICs (A), (B), (C) and.(D) in the form of an SRAM or the like. The memory IC section 1 is connected at its data, address, read/write and read terminals of the memory ICs (A), (B), (C) and (D) to associated terminals $D_0$–$D_7$, $A_0$–$A_{17}$, R/$\overline{W}$ and $\overline{OE}$ of a connector 11 (shown by a solid line in the drawing) through a data bus 2, an address bus 3, a read/write signal line 4 and a read signal line 5, respectively.

The address decoder 8 is connected to associated terminals $A_{16}$, $A_{17}$, $\overline{CS_1}$ and $CS_2$ of the connector 11 through 2 upper-bit lines of the address bus 3, a negative logical chip select signal line 6 and a positive logical chip select signal line 7, respectively. The address decoder 8 receives signals $A_{16}$, $A_{17}$, $CS_1$ and $CS_2$ from the above lines 3, 6 and 7, and generates select signals (chip select signals to select associated ones from the IC chips (A), (B), (C) and (D) of the memory IC section 1), and sends the select signals onto memory IC select lines 8a.

The memory card 10, when inserted into such an external apparatus as a host computer or a memory card reader/writer, is connected through its respective lines (including lines Vcc and GND to be explained later) with corresponding terminals of the external device. Reference symbols $D_0$–$D_7$ also denote data to be sent to the external device from the memory card 10 and $A_0$–$A_{17}$ denote address signals associated therewith.

The power supply circuit 9 has a voltage detecting circuit 91, an enable signal generating circuit 92, a power switching circuit 93 and a backup battery 94. The power supply circuit 9 is connected to associated terminals Vcc and GND of the connector 11 through a power supply line 9a and a grounding line 9b respectively. The circuit 9 functions to monitor a power supply voltage supplied from the external apparatus and to determine, at the voltage detecting circuit 91, whether or not the memory card 10 was connected to the external apparatus on the basis of a voltage Vcc on the power supply line 9a. When the card 10 is not connected with the external apparatus, the power switching circuit 93 of the power supply circuit 9 is changed over to supply power from the backup battery 94 to the memory IC section 1 and the address decoder 8, thus preventing the data stored in the memory IC section 1 from being erased. When the memory card 10 is inserted into the external apparatus, the power supply circuit 9, in response to an output detected at the voltage detector 91, sends an enable signal e to the address decoder 8 at a predetermined time.

Provided between the power supply line 9a and grounding line 9b is a series circuit which comprises a resistor R and a capacitor C. A diode D is connected in parallel with the resistor R. The series circuit is provided to suppress abrupt drop of the voltage Vcc on the power supply line 9a when the card is pulled out from the external apparatus. More in detail, the resistor R acts to prevent the erroneous operation of the external apparatus caused by the abrupt charging operation of the capacitor C at the time of inserting the card. The diode D functions, when the card is removed from the external apparatus, to prevent the voltage drop caused by the flowing of a current from the capacitor C through the resistor R.

Figure 61:
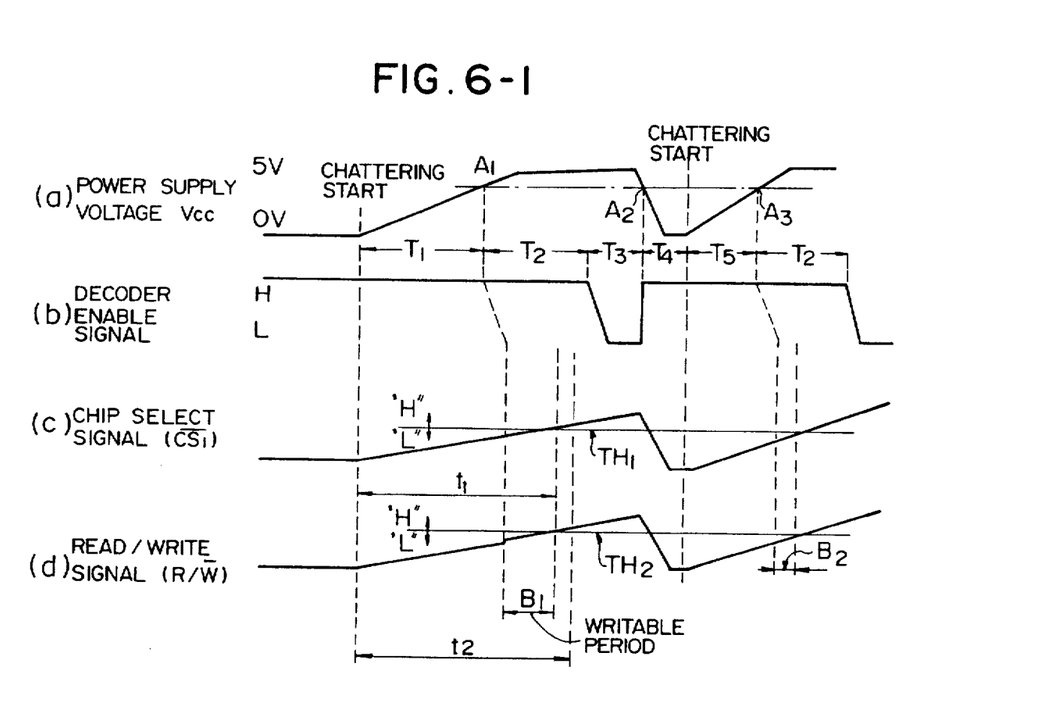
Figure 62:
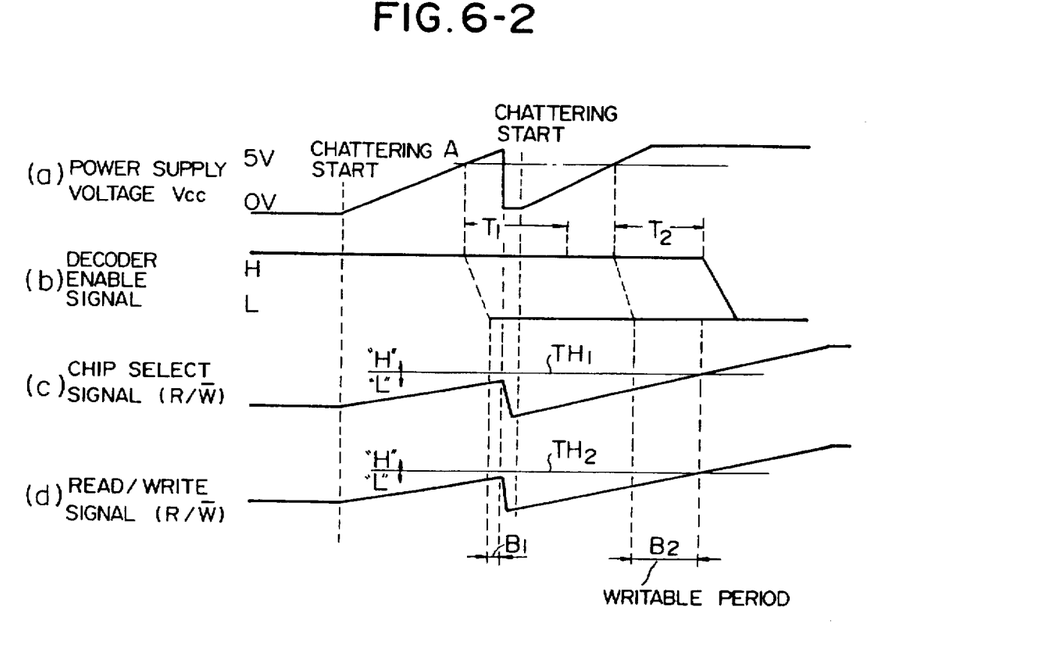

Explanation will next be made as to the operation of the memory card 10 involving undesirable chattering caused when the card is inserted into the external apparatus, by referring to FIGS. 6-1 and 6-2. More specifically, FIGS. 6-1 and 6-2 show the first and second pulses, as enlarged, of the power supply voltage Vcc in the form of a saw tooth wave in FIG. 1, when subjected to a chattering, wherein FIG. 6-1 is when the second pulse of the saw tooth wave appears after passage of a delay time $T_2$ (which will be detailed later) and FIG. 6-2 is when the second pulse of the saw tooth wave appears in the delay time $T_2$.

The generation of chattering in the power supply voltage affects other signals as shown in FIG. 1. Such a chattering problem, however, can be substantially sufficiently solved by coping with the case of the generation of the second pulse of the saw tooth wave after passage of the delay time $T_2$ (FIG. 6-1) and the case of the generation of the second pulse thereof within the delay time $T_2$.

First, in the case of FIG. 6-1, the memory card 10, when inserted into the external apparatus, is subjected to a chattering to generate a power supply voltage Vcc of such waveform as shown by (a) in FIG. 6-1 on the power supply line 9a. When such chattering takes place, the voltage detecting circuit 91 detects the chattering at a time point A (point $A_1$ in FIG. 6-1) in the power supply voltage Vcc, generates a first detection signal, and sends the first detection signal to the enable signal generating circuit 92 and power switching circuit 93.

The enable signal generator 92, when receiving the first detection signal, generates such an enable signal (significant with "L" level) shown by (b) in FIG. 6-1 as delayed by the time $T_2$, and sends the enable signal to the address decoder 8 to put the decoder 8 in its operative state.

On the other hand, the externally-supplied chip select signal $\overline{CS_1}$ and read/write signal R/$\overline{W}$ significant based on negative logic are as shown by (c) and (d) in FIG. 6-1. The address decoder 8 and memory IC 1 to be supplied with these signals $CS_1$ and R/W are large in impedance than the power supply circuit. Thus, rise times of these signals taken from "L" level at the chattering rise time point to "H" level become long and therefore times $t_1$ and $t_2$ necessary to reach "L" and "H" judgement levels $TH_1$ and $TH_2$ become longer than a rise time $T_1$ of the power supply voltage Vcc. For this reason, if such a decoder enable signal as shown by (b) in FIG. 6-1 is not used to provide a delay time $T_2$, then the decoder enable signal drops to its "L" level at the time point $A_1$ of the power supply voltage and the chip select signal $\overline{CS_1}$ and read/write signal R/$\overline{W}$ are also both at "L" level providing a period $B_1$ during which writing to the memory IC 1 is allowed, as seen from FIG. 6-1, (c) and (d). For the purpose of avoiding the generation of such a writable period $B_1$, in accordance with the present invention, when the power supply voltage reaches the time point $A_1$, the aforementioned detection signal is provided to generate a decoder enable signal L delayed by the time $T_2$.

To this end, the delay time $T_2$ is set so that the time $T_1$ plus $T_2$ are equal to or larger than shorter one of the times $t_1$ and $t_2$.

The time T can be easily realized, for example, usually by sending the detection signal of the voltage detecting circuit 91 to an integrating circuit having a capacitor and to a shaping circuit to shape the detection signal. More concretely, the period T may be set to be usually above 100 μsec, preferably between 100 μsec and 100 msec and more preferably between 100 μsec and 10 msec.

Explanation will then be made in connection with the case where the second pulse of the power supply voltage Vcc appears after passage of the delay time $T_2$ in FIG. 6-1.

When the power supply voltage Vcc subjected to a chattering drops down to a predetermined level, the voltage detecting circuit 91 detects the voltage drop, generates a second detection signal at a time point $A_2$, and supplies the second detection signal to the enable signal generating circuit 92. The second detection signal causes the decoder enable signal to rise from its "L" level to "H" level. The chip select signal $\overline{CS_1}$ and read/write signal R/$\overline{W}$ also drop from "H" level to "L" level due to the chattering. During times $T_3$ and $T_4$ until the drop of the power supply voltage caused by the chattering, since either one of the chip select signal $\overline{CS_1}$ or read/write signal R/$\overline{W}$ or decoder enable signal maintains "H" level, no writing to the memory IC 1 is carried out.

When the second chattering rise appears in the power supply voltage, there is a possibility that the chip select signal $\overline{CS_1}$ and read/write signal R/$\overline{W}$ become "L" level producing the writable period $B_2$ as mentioned above. Even under such condition, however, the voltage detecting circuit 91 detects that the power supply voltage Vcc exceeded a predetermined level $A_3$ and generates the detection signal, and the detection signal causes the decoder enable signal to be maintained at "H" level during the time $T_2$, which results in that no writing operation is carried out to the memory IC 1.

Similarly, even when the power supply voltage undergoes chattering and many saw tooth pulses appear in the power supply voltage, the writing to the memory IC 1 can be prevented substantially in the same manner as mentioned above.

Next, explanation will be made as to the case where two saw tooth pulses appear in the delay time $T_2$ with reference to FIG. 6-2.

When the power supply voltage Vcc is subjected to a chattering and the second saw tooth pulse rises in the delay time $T_2$ in the voltage wave, a drop in the power supply voltage below the predetermined level $A_2$ causes the second detection signal of the voltage detecting circuit 91 to reset the delay circuit (for generating the delay time $T_2$) provided in the enable signal generating circuit 92, whereby the decoder enable signal is kept at "H" level. When the power supply voltage Vcc again rises to above a predetermined level $A_3$, a detection signal indicative of the detection of the level $A_3$ causes the delay circuit within the enable signal generating circuit 92 to be activated so that the decoder enable signal is maintained at "H" level for the time $T_2$.

As a result, since the enable signal is kept at "H" level in both the writable periods $B_1$ and $B_2$ during which the chip select signal $\overline{CS_1}$ and read/write signal R/$\overline{W}$ are both at "L" level because of the chattering, unintended erroneous writing to the memory IC 1 is prevented.

The resetting of the delay circuit within the enable signal generating circuit 92 can be effected, for example, when the delay circuit comprises an integrating circuit having a capacitor, by putting the capacitor of the integration circuit in its discharging state with use of the second detection signal generated at the time of the detection of the voltage level $A_2$.

In this way, erroneous recording to the memory IC 1 can be prevented even in the both chattering conditions of FIGS. 6-1 and 6-2.

The power switching circuit 93, when receiving the first detection signal from the voltage detecting circuit 91, switches from the supply of power from the backup battery 94 to the supply of power from the external apparatus through the terminal Vcc of the connector 11 to generate an internal power $V_{DD}$ and sent it to the address decoder 8 and memory IC 1 through a power supply line 9c.

The operation of the memory card 10 when pulled out from the external apparatus will be explained with reference to FIG. 7.

The voltage detecting circuit 91, when the voltage Vcc on the power supply line 9a drops down to below the level A as shown by (a) in FIG. 7, detects the voltage drop, generates the second detection signal (which may be a signal of "L" or "H" level for the first detection signal of "H" or "L" level), and then sends the second detection signal to the enable signal generating circuit 92 and power switching circuit 93.

The enable signal generating circuit 92, when receiving the second detection signal, immediately stops generating the enable signal (changes the enable signal to "H" level) as shown in FIG. 7, (b) and sends it to the address decoder 8 to stop the operation of the address decoder 8. At the time of stopping the generation of the enable signal, the negative-logic significant chip select signal $\overline{CS_1}$ and read/write signal R/$\overline{W}$ both supplied from the external apparatus are kept at "H" level higher than the respective voltage-drop decision levels $TH_3$ and $TH_4$ as shown by (c) and (d) in FIG. 7. In other words, these signals are at "H" level outside the period P shown in FIG. 2. As a result, the writing conditions are not satisfied prior to the stoppage of generation of the enable signal.

With such an arrangement as mentioned above, at the time when the address decoder 8 is activated in response to the reception of the enable signal from the power supply circuit 9, chattering pulses disappear completely in the respective control signals, whereby the memory card is operated without any erroneous writing operation and when the card is removed out of the external apparatus, the operation of the card can also be stopped without any erroneous writing operation because the writing conditions are not satisfied prior to the stoppage of generation of the enable signal.

Although the writing operation caused by the chattering at the time of inserting the card and the writing operation by the delayed operation of the voltage detecting circuit at the time of removing the card have been both prevented in the foregoing embodiment, either one writing operation at the time of inserting or removing the card may be prevented.

The voltage detecting circuit and enable signal generating circuit in the power supply circuit 9 of the present embodiment may be an initial reset circuit, a mere reset circuit or the like circuit, in which case the reset signal can be used as it is or its inverted signal can be used as the enable signal to the decoder.

Further, the logic of the "H" and "L" signals used in the present embodiment may be determined by the party circuits receiving such logical signals and thus the present invention is not limited to the logic of the "H" and "L" logical signals employed in the illustrated embodiment.

Furthermore, the memory card has employed the two chip select signals in the foregoing embodiment, but a single chip select signal may be employed and may be called a chip enable signal, memory request signal or the like. That is, the chip select signal may be called freely so long as the signal is used to select the chips.

In any case, the enable signal must be used to make invalid the chip select signal at the time of inserting or removing the memory card.

Explanation will next be made by referring to FIG. 8 as to a memory card 10 and a data processing device 20 therefor in accordance with another embodiment of the present invention.

Figure 8:
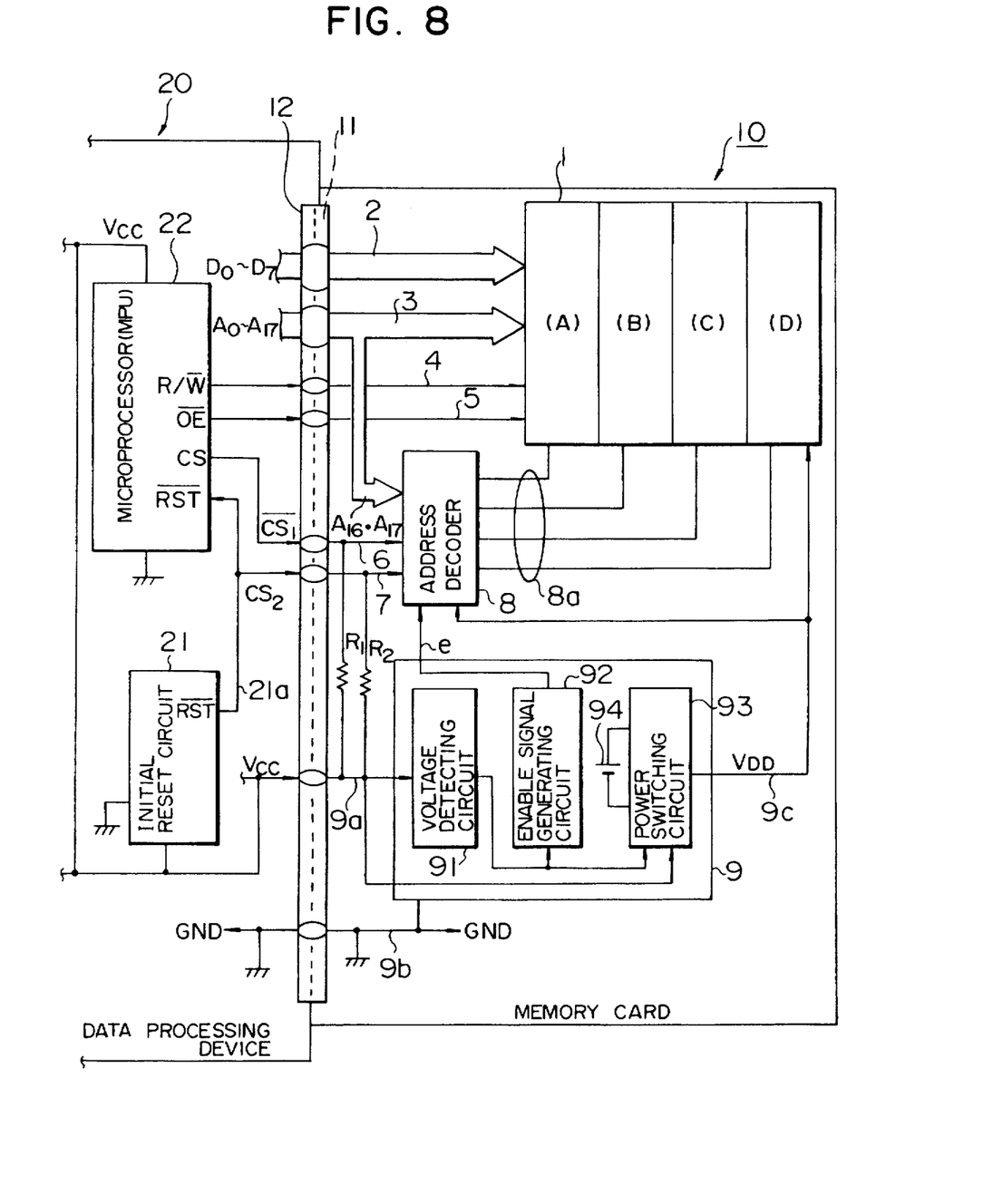
FIG. 8 is an arrangement of a data processing system including a memory card and a data processing device in accordance with another embodiment of the present invention.

The memory card 10 of FIG. 8 is inserted into the data processing device 20 as connected to a connector 12 of the data processor 20 through a connector 11 of the card 10. FIG. 8 shows a state in which the card 10 is already inserted in the data processor 20. Explanation for the same parts as those in the foregoing embodiment is omitted.

More specifically, the data processor 30 includes an MPU 22 and an initial resetting circuit 21 which is connected at its reset terminal $\overline{RST}$ to a reset terminal $\overline{RST}$ of the MPU 22 through a reset line 21a and which is also connected, when the memory card 10 is inserted into the data processor 20, to the positive-logic chip select signal line 7 of the memory card 10 through the terminal $CS_2$ of the connector 11. Thus, when the memory card 10 is inserted in the data processor 20, the initial resetting circuit 21 supplies a reset signal $CS_2$ onto the positive-logic chip select signal line 7.

More in detail, the initial reset circuit 21 outputting a significant "L" reset signal is usually put in its high impedance state. Accordingly, when the reset circuit 21 generates no reset signal, the signal $CS_2$ of logical level determined by the memory card 10 appears on the positive-logic chip select signal line 7. As illustrated, within the memory card 10, the signals $CS_2$ and $\overline{CS_1}$ on the positive-logic and negative-logic chip select signal lines 7 and 6 are both pulled up with respect to the power supply voltage Vcc by means of resistors $R_1$ and $R_2$ and maintained at "H" level. Further, when the memory card 10 is inserted into the data processor 20, the enable signal generating circuit 92 sends the enable signal e to the address decoder 8 at a predetermined time in response to the reception of a detection output from the voltage detecting circuit 91.

With such a circuit, the selection of one of the memory ICs (A), (B), (C) and (D) of the memory IC section 1 by the address decoder 8 is carried out, when the signal $CS_2$ on the positive-logic chip select signal line 7 is at the "H" level and the signal $\overline{CS_1}$ on the negative-logic chip select signal line 6 is at the "L" level, on the basis of the values of the address signals $A_{16}$ and $A_{17}$ and the selected memory IC is made active. Therefore, in the case where the signal $CS_2$ on the positive-logic chip select signal line 7 is at the "L" level and the signal $\overline{CS_1}$ on the negative-logic chip select signal line 6 is at the "H" level, even when the address decoder 8 is operated, the address decoder generates no select signal to the memory ICs (A), (B), (C) and (D), with the result that the respective memory ICs remain inoperative.

When the initial reset circuit 21 generates the "L" significant reset signal, on the other hand, the signal $CS_2$ on the positive-logic chip select signal line 7 is at the "L" level. As a result, the address decoder 8 generates no select signal and thus the memory card 10 becomes inoperative.

Figure 9:
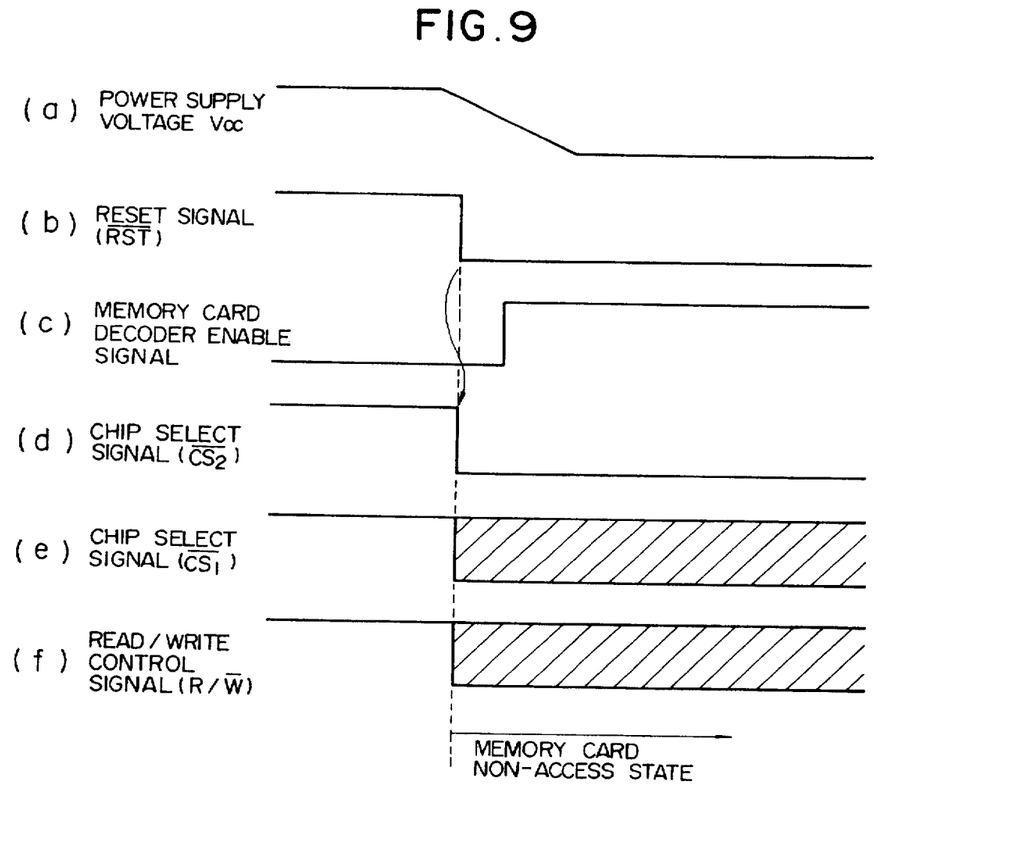
FIG. 9 is a timing chart of control signals appearing in the system of FIG. 8 for explaining the resetting operation of the system.

More specifically, when a power supply voltage Vcc as the power supply voltage of the data processor 20 drops down to below a predetermined voltage detection level as shown by (a) in FIG. 9, the initial reset circuit 21 generates a reset signal $\overline{RST}$ such as shown by (b) in FIG. 9. At this time, since the MPU 22 is reset by the initial reset circuit 21 and a chip select signal $CS_2$ such as shown by (d) is at the "L" level, the address decoder 8 generates no memory IC select signal. Thus, even when the chip select signal $\overline{CS_1}$ and read/write control signal $R/\overline{W}$ are both at the "L" level as shown by (e) and (f), this does not affect the memory card. Even in the case where the supply voltage Vcc of the power supply line 9a to the memory card 10 further drops and the voltage detecting circuit 91 of the card 10 detects the further voltage drop and generates such an enable signal as shown by (c), the address decoder 8 generates no select signal without causing any problem.

When the initial reset circuit 21 generates no reset signal, the signal $CS_2$ on the positive-logic chip select signal line 7 is at "H" level and thus it is selected whether or not the memory card 10 is operated on the basis of the signal $\overline{CS_1}$ on the negative-logic chip select signal line 6.

Figure 10:
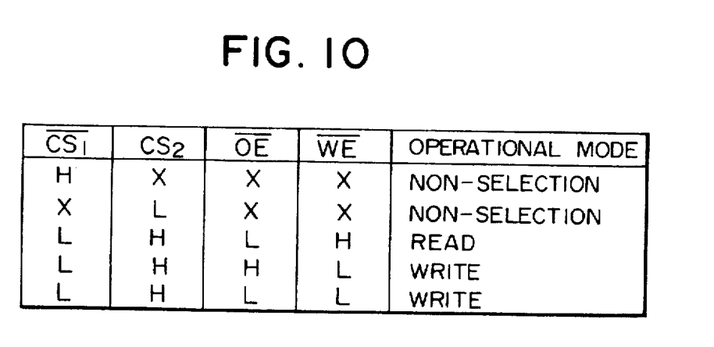
FIG. 10 is a diagram for explaining the operation of the memory card in FIG. 8.

Such selecting operation of the data processor 20 to the memory card 10 is shown in FIG. 10. In the drawing, reference symbol L corresponds to the "L" level and H corresponds to the "H" level. Further, symbol X means that the state is not determined.

With such an arrangement, when the memory card 10 is inserted into the data processing device 20, the card 10 is controlled by the chip select signal $\overline{CS_1}$ for its write/read operation; while when the MPU 22 is reset to stop its operation, the operation of the memory card 10 is also stopped.

The voltage detecting circuit and enable signal generating circuit in the power supply circuit 9 of the foregoing embodiment may include an initial reset circuit as already mentioned earlier, in which case its reset signal can be used as it is or its inverted signal can be used as the enable signal to the decoder.

Though the initial reset circuit has been used in the foregoing embodiment, the circuit may comprise a mere reset circuit. Further, the initial reset circuit has been set to have a high impedance at its reset terminal when the circuit generates no reset signal, but the reset terminal may be set to have a "H" level.

Furthermore, the relation between "H" and "L" for the logical signals used in the present embodiment are determined by the party circuits receiving the logical signals, but the present invention is not restricted to the illustrated example of the "H"/"L" relation and the "H"/"L" relation may be freely selected as necessary.

As has been described in the foregoing, the enable signal generating circuit, in response to the reception of an output from the voltage detecting circuit, sends an enable signal at a suitable time to the address decoder after passage of an unstable period caused by the generation of chattering. As a result, when the respective control signals are unstable under the influence of the chattering, the decoder can be made inoperative and the selection of the memory ICs can be stopped, whereby the writing operation under the chattering condition can be reliably avoided. Further, at the time when the enable signal to the decoder is generated, the respective control signals and power supply voltage are all in the stable state and the decoder itself is also stable, whereby any erroneous operation can be prevented and the data stored in the memory ICs can be protected.

In addition, since the insertion of the capacitor between the power supply terminal of the external power source and the ground prevents immediate drop of the voltage at the time of pulling out the card, drops in the voltages at the pulled-up chip select signal terminal and at the write control signal terminal can be made slow, so that the voltage levels can be kept within the "H" level range until the enable signal of the decoder is stopped. As a result, the writable period at the time of removing the card can be eliminated and thus the erroneous write operation at the time of removing the card can be prevented.

Furthermore, one of the terminals of the memory card receiving the two chip select signals is used for receiving the chip select signal from the MPU of the data processor while the other terminal is for receiving the reset signal from the initial reset circuit of the data processor, whereby the selection of the memory card with use of the reset signal can be prevented and at the same time as the data processor is reset, the memory card can be made inoperative.

As a result, even when the power supply voltage of the data processor with the memory card inserted drops or is cut off due to a power failure or the like, it can be prevented that the memory card is subjected to an erroneous write operation and thus the data stored in the memory card is protected.

What is claimed is:

1. A memory card comprising:

a plurality of memory ICs, an address decoder for selecting one of said memory ICs by decoding a part of an address signal received from an external apparatus when a control signal is received, a voltage terminal for receiving a supply voltage from said external apparatus, a voltage detecting circuit connected to said voltage terminal for generating a first detection signal when the supply voltage received from said external apparatus exceeds a predetermined value, and for generating a second detection signal when the supply voltage received from said external apparatus is less than said predetermined value, a power switching circuit connected to said voltage terminal, and including a backup battery, for supplying said supply voltage received from said external apparatus to said plurality of ICs and said address decoder when said first detection signal or said control signal is received, and supplying a supply voltage from said backup battery to said plurality of ICs and said address decoder when said first detection signal or said control signal is not received, a decoder enable signal generating circuit connected to said voltage detecting circuit and said address decoder for generating and feeding said control signal to said address decoder when said first detection signal is received from said voltage detecting circuit and after a chip select signal or write control signal goes to a high level, and ceases supplying said control signal to said address decoder when said second detection signal from said voltage detecting circuit is received, a chip select signal terminal responsive to a chip select signal from said external apparatus and being connected to said plurality of ICs and pulled up to said supply voltage via a pull up resistor upon receiving a low activating chip select signal from said external apparatus, a write control terminal for receiving a write control signal from the external apparatus and being connected to said plurality of ICs and pulled up to said supply voltage terminal via a pull up resistor upon receiving a low activating write control signal, a write operation to one of said plurality of ICs being carried out when said chip select signal and said control signal from said decoder enable signal generating circuit are low and said decoder selects one of said plurality of ICs.

2. A memory card according to claim 1, wherein said voltage detecting circuit and decoder enable signal generating circuit comprise an initial reset circuit, and a reset signal generated by the initial reset circuit being used as the control signal to said address decoder.

3. A memory card according to claim 1, wherein said decoder enable signal generating circuit supplies said control signal to said address decoder between 100 μs to 100 ms after the detecting signal is received from said voltage detecting circuit.

4. A memory card comprising:

a plurality of memory ICs, a chip select signal terminal for receiving a chip select signal from an external apparatus, a write control signal terminal for receiving a write control signal from the external apparatus and being connected to said plurality of ICs, an address decoder connected to said chip select signal terminal for selecting one of said memory ICs by decoding a part of an address signal received from said external apparatus when a decoder enable signal is received and said chip select signal is active, a voltage terminal for receiving a supply voltage from said external apparatus, a voltage detecting circuit connected to said voltage terminal for generating a first detection signal when the supply voltage received from said external apparatus exceeds at least a predetermined value, and for generating a second detection signal when the supply voltage received from said external apparatus is less than said predetermined value, a decoder enable signal generating circuit connected to said voltage detecting circuit and said address decoder for generating and supplying said decoder enable signal to said address decoder when said first detecting signal is received from said voltage detecting circuit and after a time elapsed for a chip select signal or a write control signal becomes non-active, and ceases supplying said decoder enable signal to said address decoder when said second detecting signal from said voltage detecting circuit is received, a write operation to one of said plurality of ICs being carried out when said write control signal is active and said address decoder selects one of said plurality of ICs.

5. A memory card according to claim 4, wherein said voltage detecting circuit and decoder enable signal generating circuit comprises an initial reset circuit, and a reset signal generated by the initial reset circuit being used as the decoder enable signal to said address decoder.

6. A memory card according to claim 4, wherein said decoder enable signal generating circuit supplies said decoder enable signal to said address decoder at least 100 μsec after the first detecting signal is received from said voltage detecting circuit.

7. A memory card according to claim 4, further including a power switching circuit connected to said voltage terminal, and including a backup battery for supplying said supply voltage received from said external apparatus to said plurality of ICs and said address decoder when a predetermined voltage from the external apparatus is supplied to the voltage terminal, and supplying a supply voltage from said backup battery to said plurality of ICs and said address decoder when said predetermined voltage from the external apparatus is not supplied to the voltage terminal.

8. A memory card according to claim 4, wherein both said chip select signal and said write control signal are low-active and both said chip select signal and said write control signal terminal are connected to said voltage terminal through a pull-up register.

9. A memory card as set forth in claim 4 wherein said external apparatus comprises a data processing device.

10. A memory card according to claim 4, wherein said second detection signal is a logical inverse of said first detection signal.

11. A memory card comprising:

a plurality of memory ICs, one of which carries out a write operation when a write control signal is low and an address decoder selects one of said plurality of ICs, an address decoder for selecting one of said memory ICs by decoding a part of an address signal received from an external apparatus when a decoder an enable signal is received and said chip select signal is active, a voltage terminal for receiving a supply voltage from said external apparatus, a voltage detecting circuit connected to said voltage terminal for generating a detection signal when said supply voltage received from said external apparatus is less than a predetermined value, a decoder enable signal generating circuit connected to said voltage detection circuit and said address decoder for generating said decoder enable signal, and stopping generation of said decoder enable signal to said address decoder when said detection signal from said voltage detection circuit is received, a chip select signal terminal for receiving a low activating chip select signal from said external apparatus, connected to said address decoder, and connected to said voltage terminal via a pull up resistor, a write control signal terminal for receiving a low activating write control signal from said external apparatus, connected to said plurality of ICs, and connected to said voltage terminal via said pull up resistor, and a capacitor circuit including a capacitor having a predetermined capacitance value coupled between said voltage terminal and a ground terminal for satisfying the following condition: said capacitor has a charging time from said supply voltage received from said external apparatus to said predetermined value which is greater, when both said chip select signal and said write control signal becomes a low level voltage, than a charging time from said supply voltage received from said external apparatus to said predetermined voltage when said decoder enable signal supplied to said address decoder ceases.

12. A memory card according to claim 11, wherein said capacitor circuit includes a capacitor, and a parallel combination of a capacitor charging resistor and a capacitor discharging diode connected between said capacitor and said voltage terminal.

13. A memory card according to claim 11, further including a power switching circuit connected to said voltage terminal and including a backup battery for supplying said supply voltage to said plurality of ICs supplied from said external apparatus when said memory card is connected to said external apparatus, and supplying a supply voltage from said battery to said plurality of ICs when a predetermined voltage from the external apparatus is supplied to said voltage terminal.

14. A data processing system comprising:

data processing apparatus and a memory card connected to said data processing apparatus, wherein said data processing apparatus includes a microprocessor and a reset circuit for generating a reset signal for resetting the microprocessor when a power supply voltage is less than a predetermined value, and wherein said memory card includes, a first terminal for receiving a chip select signal from said data processing apparatus, a second terminal for receiving said reset signal from said data processing apparatus, and an address decoder connected to said first and second terminal for generating a select signal for selecting one of a plurality of memory ICs by decoding a part of an address signal received from said data processing apparatus when said chip select signal is active and said reset signal is not received, and said address decoder terminates generation of said select signal when said reset signal is received, said memory card further including said plurality of memory ICs being connected to said address decoder and wherein write processing to one of said plurality of memory ICs is carried out when said select signal from said address decoder is received, and a third terminal for receiving said supply voltage from said data processing apparatus to supply said supply voltage to said address decoder and said memory ICs.

15. A data processing system according to claim 14, wherein said memory card further includes a voltage detection circuit connected to said third terminal for generating a detection signal when said supply voltage supplied from said data processing apparatus is less than a predetermined voltage, and a decoder enable signal generating circuit connected to said voltage detection circuit and said address decoder for generating a decoder enable signal when said supply voltage is received from said data processing apparatus and a stop sending decoder enable signal to said address decoder when said detection signal is received from said voltage detection circuit, said address decoder generating said select signal only when said decoder enable signal is received.

16. A data processing system according to claim 15, wherein said memory card further includes a voltage switching circuit connected to said third terminal and a battery, and wherein said voltage switching circuit supplies said supply voltage from said data processing apparatus to said plurality of memory ICs when said memory card is connected to said data processing apparatus, and supplies voltage from said battery to said plurality of memory ICs when a predetermined supply voltage from the data processing apparatus is supplied to the third terminal.

* * * * *